(12) United States Patent
Tamai et al.

(10) Patent No.: US 9,466,508 B2
(45) Date of Patent: Oct. 11, 2016

(54) LIQUID COMPOSITION USED IN ETCHING MULTILAYER FILM CONTAINING COPPER AND MOLYBDENUM, MANUFACTURING METHOD OF SUBSTRATE USING SAID LIQUID COMPOSITION, AND SUBSTRATE MANUFACTURED BY SAID MANUFACTURING METHOD

(71) Applicant: MITSUBISHI GAS CHEMICAL COMPANY, INC., Chiyoda-ku (JP)

(72) Inventors: Satoshi Tamai, Tokyo (JP); Kunio Yube, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 14/763,891

(22) PCT Filed: Apr. 9, 2014

(86) PCT No.: PCT/JP2014/060325
§ 371 (c)(1),
(2) Date: Jul. 28, 2015

(87) PCT Pub. No.: WO2014/175071
PCT Pub. Date: Oct. 30, 2014

(65) Prior Publication Data
US 2015/0380273 A1    Dec. 31, 2015

(30) Foreign Application Priority Data

Apr. 23, 2013   (JP) .................. 2013-090553

(51) Int. Cl.
| | | |
|---|---|---|
| *H01L 21/4763* | (2006.01) | |
| *C09K 13/00* | (2006.01) | |
| *H01L 21/3213* | (2006.01) | |
| *C23F 1/02* | (2006.01) | |
| *C23F 1/18* | (2006.01) | |
| *C23F 1/26* | (2006.01) | |
| *C23F 1/44* | (2006.01) | |
| *H05K 3/06* | (2006.01) | |
| *H01L 27/12* | (2006.01) | |

(Continued)

(52) U.S. Cl.
CPC ......... *H01L 21/47635* (2013.01); *C09K 13/00* (2013.01); *C23F 1/02* (2013.01); *C23F 1/18* (2013.01); *C23F 1/26* (2013.01); *C23F 1/44* (2013.01); *H01L 21/32134* (2013.01); *H01L 27/124* (2013.01); *H01L 27/1225* (2013.01); *H01L 27/1259* (2013.01); *H05K 3/067* (2013.01); *H05K 2201/0338* (2013.01)

(58) Field of Classification Search
CPC ........... H01L 21/47635; H01L 27/124; H01L 27/1259; H01L 27/1225
See application file for complete search history.

(56) References Cited

U.S. PATENT DOCUMENTS

| | | | |
|---|---|---|---|
| 6,426,020 B1 | 7/2002 | Okada et al. | |
| 9,034,690 B2 * | 5/2015 | Van Duren | ....... H01L 21/30604 438/104 |
| 2012/0319033 A1 | 12/2012 | Okabe et al. | |
| 2014/0131615 A1 | 5/2014 | Tamai et al. | |
| 2014/0162403 A1 | 6/2014 | Okabe et al. | |
| 2016/0053384 A1 * | 2/2016 | Adaniya | .................. C23F 1/18 174/257 |

FOREIGN PATENT DOCUMENTS

| | | |
|---|---|---|
| JP | 47-31838 A | 11/1972 |
| JP | 60-243286 A | 12/1985 |
| JP | 61-591 A | 1/1986 |
| JP | 2001-200380 A | 7/2001 |
| JP | 2012-129304 A | 7/2012 |
| WO | 2011/099624 A1 | 8/2011 |
| WO | 2013/005631 A1 | 1/2013 |
| WO | 2013/015322 A1 | 1/2013 |

* cited by examiner

OTHER PUBLICATIONS

International Search Report issued Jul. 8, 2014 in PCT/JP2014/060325 filed Apr. 9, 2014.

*Primary Examiner* — Luan C Thai
(74) *Attorney, Agent, or Firm* — Oblon, McClelland, Maier & Neustadt, L.L.P.

(57) ABSTRACT

The present invention provides a liquid composition used for etching a multilayer film containing copper and molybdenum, an etching method for etching a multilayer film containing copper and molybdenum, and a substrate. The present invention further provides a liquid composition for etching a multilayer-film wiring substrate which has an oxide layer (IGZO) including indium, gallium and zinc laminated on the substrate, and further a multilayer film including at least a layer containing molybdenum and a layer containing copper provided thereon, a method for etching a multilayer film containing copper and molybdenum from the substrate, and a substrate. According to the present invention, a liquid composition comprising (A) a maleic acid ion source, (B) a copper ion source, and (C) at least one type of amine compound selected from the group consisting of 1-amino-2-propanol, 2-(methylamino)ethanol, 2-(ethylamino)ethanol, 2-(butylamino)ethanol, 2-(dimethylamino)ethanol, 2-(diethylamino)ethanol, 2-methoxyethylamine, 3-methoxypropylamine, 3-amino-1-propanol, 2-amino-2-methyl-1-propanol, 1-dimethylamino-2-propanol, 2-(2-aminoethoxyl)ethanol, morpholine and 4-(2-hydroxyethyl)morpholine and having a pH value of 4-9 is used.

16 Claims, 5 Drawing Sheets

← Molybdenum/copper/molybdenum

← Membrane-like molybdenum residue

LIQUID COMPOSITION USED IN ETCHING MULTILAYER FILM CONTAINING COPPER AND MOLYBDENUM, MANUFACTURING METHOD OF SUBSTRATE USING SAID LIQUID COMPOSITION, AND SUBSTRATE MANUFACTURED BY SAID MANUFACTURING METHOD

TECHNICAL FIELD

The present invention relates to a liquid composition. More particularly, the present invention relates to a liquid composition used for etching a copper- and molybdenum-containing multilayer film, a method for manufacturing multilayer-film wiring by using the same, and a manufactured substrate.

BACKGROUND ART

Conventionally, aluminum or an aluminum alloy has generally been used as a wiring material for a display device such as a flat panel display. With upsizing and resolution enhancement of the display, however, such aluminum wiring materials became to raise a problem of signal delay due to the properties thereof such as wiring resistance, causing difficulty in displaying a uniform screen.

While copper has an advantage over aluminum in terms of lower resistance, it causes a problem of insufficient adhesion between the substrate (for example, a glass substrate) and the copper when used for gate wiring. In addition, in a case where copper is used for source-drain wiring, there are problems as follows: copper may diffuse into the underlying silicon semiconductor film; copper may be oxidized due to diffusion of oxygen from the oxide semiconductor film; and the like.

In order to solve the above-described problems, multilayer-film wiring has been studied in which a copper layer is provided via a barrier film made of a metal having high adhesion to a substrate (for example, a glass substrate) and also having a barrier property for preventing diffusion into the semiconductor film. As metals having both adhesion and a barrier property, metals such as molybdenum and titanium are known. The multilayer-film wiring employs a two-layer multilayer film in which a layer made of copper and a layer made of a metal having both adhesion and a barrier property or an alloy of such metal are laminated, or a three-layer multilayer film in which a layer made of a metal such as molybdenum or titanium or an alloy thereof is further laminated on said copper layer in order to prevent oxidation of the layer made of copper.

Copper- and molybdenum-containing multilayer-film wiring can be obtained by forming the above-described multilayer film on a substrate (for example, a glass substrate) by a film formation process such as sputtering, and subjecting the resultant to etching using a resist as a mask to form an electrode pattern.

Etching processes include wet etching that uses an etchant and dry etching that uses an etching gas such as plasma. Characteristics such as follows are required for the etchant used for wet etching:
high processing accuracy;
highly stabile and safe components and easy handling;
stable etching performance; and
good wiring configuration should result after etching.

Generally, as an etchant used in the step of etching copper, an acidic etchant containing hydrogen peroxide and an acid and an acidic etchant containing peroxosulfate and an acid are known. However, if such an etchant containing hydrogen peroxide or peroxosulfuric acid is used, there is a problem of generation of gas and heat due to decomposition of hydrogen peroxide or peroxosulfuric acid. There is also a problem of change in the etching performance due to decomposition of the components.

As peroxide-free etchants for copper, an ammonia alkaline etchant containing a copper (II) ion and ammonia is known. Such ammonia alkaline etchants are also capable of etching a multilayer film containing copper. However, since this etchant has high pH, a large amount of ammonia is volatilized from this etchant and thus the ammonia concentration is decreased, which may result in fluctuation in the etching rate or significant aggravation of the working environment. In addition, there is also a problem of dissolution of the resist if the pH is high.

As an etchant for selectively etching a copper layer in a multilayer film comprising a metal oxide layer containing an oxide of a metal selected from Zn, Sn, Al, In and Ga and the copper layer, an etchant containing a copper (II) ion, an organic acid and an amino group-containing compound and having pH of 5.0-10.5 has been proposed (Patent Document 1). This document, however, does not mention about etching a multilayer film containing copper and molybdenum. Moreover, although this etchant is capable of removing copper, its removal property against molybdenum is low (see Comparative Example 3). Thus, it is not suitable for etching a multilayer film containing copper and molybdenum.

As an etchant for copper or a copper alloy, an etchant containing a copper (II) ion, aliphatic carboxylic acid, a halogen ion and alkanolamine has been proposed (Patent Document 2).

Additionally, as an etchant for copper or a copper alloy, an etchant containing a copper (II) ion, an organic acid ion and maleic acid ion has been proposed (Patent Document 3). This document describes that said etchant can also be applied to etching of a multilayer film including copper and molybdenum.

Meanwhile, recently, in order to meet the requirements of upsizing, high-definition and low power consumption of the display, an oxide semiconductor (IGZO) having a structure in which the semiconductor layer beneath the wiring is composed of indium (In), gallium (Ga) and zinc (Zn) has been studied.

If IGZO is employed for a semiconductor layer, post annealing at a high temperature is required for improving reliability, which leads to oxidization of copper as the wiring material and causes a problem of increasing the wiring resistance. Accordingly, in order to prevent copper oxidization, a multilayer structure using molybdenum as a upper metal cap layer on copper has been studied (for example, a multilayer film of molybdenum/copper/molybdenum), in which case, molybdenum needs to be formed into a thick film in order to prevent copper oxidization by post annealing at a high temperature.

However, when a conventional copper/molybdenum etchant is used to etch the above-mentioned copper- and molybdenum-containing multilayer film in which molybdenum is formed into a thick film, there are a problem that the removal property against molybdenum is insufficient such that the upper molybdenum layer may remain as an eave and a problem that the underlying molybdenum layer may remain due to tailing. Therefore, there has been a need for an etchant that is capable of etching a multilayer containing copper and a thickly-formed molybdenum to have a good etching configuration.

PRIOR ART DOCUMENTS

Patent Documents

Patent Document 1: Japanese Unexamined Patent Application Publication No. 2012-129304
Patent Document 2: Japanese Unexamined Patent Application Publication No. 2001-200380
Patent Document 3: International Publication No. 2013-5631

SUMMARY OF THE INVENTION

Problems to be Solved by the Invention

Under such circumstances, there have been needs for a liquid composition used for etching a multilayer film containing copper and molybdenum, and a method for manufacturing a multilayer-film wiring substrate using the same, in which a multilayer film containing copper and molybdenum is provided on a substrate.

Recently, the present inventors found that use of a liquid composition containing a copper ion source, a maleic acid ion source and a specific amine compound can solve the above-described problems.

Means for Solving the Problems

The present invention is as follows.
1. A liquid composition for selectively etching a layer made of copper or a compound containing copper as a primary component and a layer made of molybdenum or a compound containing molybdenum as a primary component from a substrate having a multilayer film comprising the layer made of copper or a compound containing copper as a primary component and the layer made of molybdenum or a compound containing molybdenum as a primary component laminated thereon, the liquid composition comprising:
    (A) a maleic acid ion source;
    (B) a copper ion source; and
    (C) an amine compound of at least one type selected from the group consisting of 1-amino-2-propanol, 2-(methylamino)ethanol, 2-(ethylamino)ethanol, 2-(butylamino)ethanol, 2-(dimethylamino)ethanol, 2-(diethylamino)ethanol, 2-methoxyethylamine, 3-methoxypropylamine, 3-amino-1-propanol, 2-amino-2-methyl-1-propanol, 1-dimethylamino-2-propanol, 2-(2-aminoethoxyl)ethanol, morpholine and 4-(2-hydroxyethyl)morpholine,
wherein the pH value is 4-9.
2. The liquid composition according to Item 1, wherein the ratio of the film thickness of the layer made of molybdenum or a compound containing molybdenum as a primary component (thickness of molybdenum film) to the film thickness of the layer made of copper or a compound containing copper as a primary component (thickness of copper film) (if each layer consists of multiple layers, then total film thickness of the multiple layers) (thickness of molybdenum film/thickness of copper film) is 0.05-1. Although this ratio may vary depending on the use of the multilayer-film wiring, in order for the layer containing molybdenum or molybdenum as a primary component to exert the effect as a barrier film, the ratio of thickness of molybdenum film/thickness of copper film is, in general, preferably 0.01 or more, more preferably 0.05 or more and particularly preferably 0.1 or more. On the other hand, since molybdenum or a compound containing molybdenum as a primary component is an expensive material as compared to copper or a compound containing copper as a primary component, the ratio of thickness of molybdenum film/thickness of copper film is preferably 2 or less, more preferably 1 or less and particularly preferably 0.5 or less from an economical standpoint.
3. The liquid composition according to either one of Items 1 and 2, wherein the maleic acid ion source (A) is at least one type selected from the group consisting of maleic acid and maleic anhydride.
4. The liquid composition according to any one of Items 1-3, wherein the copper ion source (B) is at least one type selected from the group consisting of copper, copper sulfate, copper nitrate, copper acetate and copper hydroxide.
5. The liquid composition according to any one of Items 1-4, wherein the mix proportion of the maleic acid ion source (A) to the copper ion source (B) is 0.1-10 on molar basis.
6. The liquid composition according to any one of Items 1-5, wherein the mix proportion of the amine compound (C) to the copper ion source (B) is 2-20 on molar basis.
7. The liquid composition according to any one of Items 1-6, further comprising (D) a carboxylic acid ion source.
8. The liquid composition according to Item 7, wherein the carboxylic acid ion source (D) is at least one type selected from the group consisting of acetic acid, glycolic acid, malonic acid, succinic acid, lactic acid, citric acid, carboxylates thereof and acetic anhydride.
9. The liquid composition according to either one of Items 7 and 8, wherein the mix proportion of the carboxylic acid ion source (D) to the copper ion source (B) is 0.1-10 on molar basis.
10. The liquid composition according to any one of Items 1-9, further comprising (E) a molybdic acid ion source.
11. The liquid composition according to any one of Items 1-10, which selectively etches a layer made of copper or a compound containing copper as a primary component and a layer made of molybdenum or a compound containing molybdenum as a primary component from a substrate having an oxide layer made of indium, gallium and zinc (IGZO) laminated thereon and further having a multilayer film comprising the layer made of copper or a compound containing copper as a primary component and the layer made of molybdenum or a compound containing molybdenum as a primary component laminated thereon.
12. A method for selectively etching a multilayer film comprising a layer made of copper or a compound containing copper as a primary component and a layer made of molybdenum or a compound containing molybdenum as a primary component from a substrate having a multilayer film comprising the layer made of copper or a compound containing copper as a primary component and the layer made of molybdenum or a compound containing molybdenum as a primary component laminated thereon, the method comprising the step of bringing the liquid composition according to any one of Items 1-11 into contact with the multilayer film.
13. The etching method according to Item 12, wherein the multilayer film is a two-layer film in which a layer made of molybdenum or a compound containing molybdenum as a primary component is laminated with a layer made of copper or a compound containing copper as a primary component.
14. The etching method according to Item 12, wherein the multilayer film is a three-layer film in which a layer made of molybdenum or a compound containing molybdenum as a primary component, a layer made of copper or a compound containing copper as a primary component and a layer made of molybdenum or a compound containing molybdenum as a primary component are laminated in this order.

15. A method for manufacturing a multilayer-film wiring substrate in which a multilayer film comprising at least a layer made of copper or a compound containing copper as a primary component and a layer made of molybdenum or a compound containing molybdenum as a primary component is provided on a substrate, the method comprising the steps of:

sequentially providing a layer made of molybdenum or a compound containing molybdenum as a primary component and a layer made of copper or a compound containing copper as a primary component on the substrate to form a multilayer film;

covering the multilayer film with a resist to form a resist film;

exposing and developing the resist film to form a predetermined resist pattern, thereby forming an object to be etched; and bringing the object to be etched into contact with the liquid composition according to any one of Items 1-11 to etch the multilayer film, thereby forming multilayer-film wiring.

16. A multilayer-film wiring substrate manufactured by the manufacturing method according to Item 15.

Effect of the Invention

The liquid composition according to the present invention is capable of etching a multilayer film containing copper and molybdenum together at a good etching rate (in a preferable embodiment of the present invention, the just-etch time that takes to complete the etching of the copper- and molybdenum-containing multilayer film to expose the base is about 30-400 seconds, which is about 0.1-1 μm/min in terms of an etching rate). Accordingly, the productivity and the controllability of etching can be improved.

Since the liquid composition of the present invention is free of ammonia, no odor is generated due to volatilization of ammonia and thus it is easy to handle. Moreover, since the liquid composition of the present invention does not contain hydrogen peroxide or peroxosulfuric acid ion, generation of gas or heat due to the decomposition reaction thereof is not remarkable, and thus etching can be carried out safely and stably.

In a preferable embodiment of the present invention, since the liquid composition of the present invention has higher molybdenum removal property as compared to a conventional etchant for copper/molybdenum, molybdenum does not remain even in a case of multilayer-film wiring containing copper and thickly-formed molybdenum. Furthermore, since it has no damage on the IGZO semiconductor layer, it can selectively etch copper and molybdenum in a wiring structure comprising a multilayer film containing copper and molybdenum as well as IGZO.

Accordingly, a liquid composition used for etching copper- and molybdenum-containing multilayer-film wiring can be realized, which can cope with upsizing, resolution enhancement and reduction in the power consumption of the display.

In addition, in a preferable embodiment of the present invention, change in the etching rate of the liquid composition of the present invention is small even when copper or molybdenum is dissolved upon etching, and thus it has an advantage in use for prolonged etching. Moreover, although the dissolved copper and molybdenum will be mixed with the liquid composition upon etching, these mixed components will serve as a copper ion source (B) or a molybdic acid ion source (E). Therefore, components that do not contain components (B) and (E) (namely, components (A), (C), (D) and (F)) can be added to the liquid composition undergoing etching so as to reproduce the composition of the liquid composition before etching. As a result, it can be used for etching for a longer period of time.

MODES FOR CARRYING OUT THE INVENTION

<Liquid Composition>

A liquid composition of the present invention is used for etching a copper- and molybdenum-containing multilayer film, and comprises at least (A) a maleic acid ion source, (B) a copper ion source and (C) an amine compound of at least one type selected from the group consisting of 1-amino-2-propanol, 2-(methylamino)ethanol, 2-(ethylamino)ethanol, 2-(butylamino)ethanol, 2-(dimethylamino)ethanol, 2-(diethylamino)ethanol, 2-methoxyethylamine, 3-methoxypropylamine, 3-amino-1-propanol, 2-amino-2-methyl-1-propanol, 1-dimethylamino-2-propanol, 2-(2-aminoethoxyl)ethanol, morpholine and 4-(2-hydroxyethyl)morpholine.

According to the present invention, by using a liquid composition containing such specific components, wiring having a multilayer-film structure containing copper and molybdenum can be etched together at a good etching rate (in a preferable embodiment of the present invention, the just-etch time that takes to complete the etching of the copper- and molybdenum-containing multilayer film to expose the base is about 30-400 seconds, which is about 0.1-1 μm/min in terms of an etching rate). Furthermore, since the liquid composition of the present invention is free of ammonia, no odor is generated and no change is caused in the ammonia concentration due to volatilization, and thus handling is easy. Moreover, since no gas or heat is generated due to decomposition of hydrogen peroxide or peroxosulfuric acid ion in the liquid composition of the present invention, safe and stable etching can be performed. In addition, in a preferable embodiment of the present invention, since the liquid composition of the present invention has high molybdenum removal property, molybdenum is not left behind even in a multilayer film containing copper and thickly-formed molybdenum.

Herein, "a copper- and molybdenum-containing multilayer film" refers to a multilayer film comprising at least a layer containing copper and a layer containing molybdenum, preferably it refers to a multilayer film comprising at least a layer made of copper or a compound containing copper as a primary component and a layer made of molybdenum or a compound containing molybdenum as a primary component. Herein, "a compound containing copper as a primary component" refers to a compound containing copper at 50% or higher, preferably 60% or higher, and more preferably 70% or higher on weight basis. "A compound containing molybdenum as a primary component" refers to a compound containing molybdenum at 50% or higher, preferably 60% or higher, and more preferably 70% or higher on weight basis.

Figure 1:
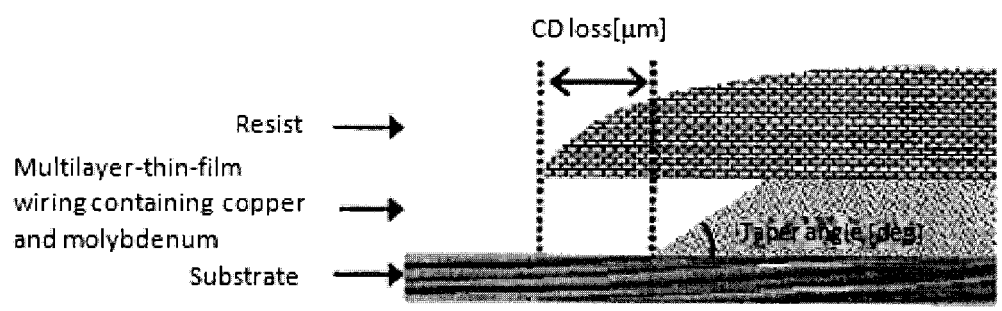
FIG. 1 A schematic cross-sectional view of wiring having a multilayer-film structure comprising copper and molybdenum, which had been etched using the liquid composition of the present invention.

The liquid composition according to the present invention can be used to etch a copper- and molybdenum-containing multilayer film to have a good multilayer-film wiring configuration. Here, the good wiring configuration of the multilayer-film wiring mentioned above will be described. FIG. 1 is a schematic cross-sectional view of wiring having a multilayer-film structure comprising copper and molybdenum (multilayer-film wiring), which had been etched using the liquid composition of the present invention. As shown in FIG. 1, a multilayer film comprising a layer containing copper (copper layer) and a layer containing molybdenum (molybdenum layer) is laminated on a substrate, on which a resist is laminated. The multilayer film is etched to obtain multilayer-film wiring.

In the multilayer-film wiring obtained by etching, it is important that the angle (θ) between the etched plane at the edge of the multilayer-film wiring and the substrate makes a forward taper angle, which is preferably 15-75 degrees, more preferably 20-70 degrees and particularly preferably 25-70 degrees. If the taper angle is smaller than 15 degrees, the cross-sectional area of the wiring becomes small, which is unfavorable since fine wiring may result in disconnection. If the taper angle is larger than 75 degrees, the coverage of a film such as an insulating film on the upper layer of the wiring may become poor, which is unfavorable. Furthermore, the horizontal distance from the edge of the barrier film constituting the bottom layer of the multilayer-film wiring to the edge of the resist (bottom critical dimension loss, also briefly referred to as bottom CD loss) is preferably 2.5 μm or less, more preferably 1.8 μm or less and particularly preferably 1.5 μm or less. If the bottom CD loss is greater than 2.5 μm, the cross-sectional area of the wiring becomes smaller, which is unfavorable. Additionally, loss upon etching becomes greater. According to the present invention, a liquid composition containing a maleic acid ion source, a copper ion source and a specific amine compound can be used to etch a copper- and molybdenum-containing multilayer film having a good configuration. Hereinafter, each of the components constituting the liquid composition of the present invention will be described.

(A) Maleic Acid Ion Source

A maleic acid ion source (hereinafter, sometimes simply referred to as component (A)) contained in a liquid composition of the present invention forms a complex with a copper ion and serves as an etching agent for copper. The maleic acid ion source is not particularly limited as long as it is capable of supplying a maleic acid ion, preferable examples being maleic acid and maleic anhydride. These maleic acid ion sources may be used alone or some of them may be used as a mixture. Among these, maleic acid and maleic anhydride are preferable in terms of solubility into water, good stability in the liquid composition and good etching performance.

The maleic acid ion source (component (A)) is contained, per kilogram of the liquid composition, preferably in a range of 0.05-5 mol, more preferably in a range of 0.1-5 mol, and particularly preferably in a range of 0.1-3 mol.

Moreover, the mix proportion of the maleic acid ion source (component (A)) to the later-described copper ion source (component (B)) is, on molar basis, preferably in a range of 0.05-20, more preferably in a range of 0.05-10 and particularly preferably in a range of 0.1-10. As long as the content of the maleic acid ion source (component (A)) in the liquid composition of the present invention is within the above-mentioned range, the etching rate and the wiring configuration can be further improved.

(B) Copper Ion Source

A copper ion source (hereinafter, sometimes simply referred to as component (B)) contained in the liquid composition of the present invention is a component that serves as an oxidant for copper. The copper ion source is not particularly limited as long as it is capable of supplying a copper (II) ion, preferable examples, besides copper, being copper salts such as copper sulfate, copper nitrate, copper acetate, copper hydroxide, cupric chloride, cupric bromide, cupric fluoride, cupric iodide and ammonium copper sulfate. These copper ion sources may be used alone or some of them may be used as a mixture. Among these, copper, copper sulfate, copper nitrate, copper hydroxide, and copper acetate are particularly preferable.

The copper ion source (component (B)) is contained, per kilogram of the liquid composition, preferably in a range of 0.01-4 mol, more preferably in a range of 0.01-2 mol, and particularly preferably in a range of 0.02-2 mol. As long as the content of the copper ion source (component (B)) in the liquid composition of the present invention is within the above-mentioned range, the etching rate and the wiring configuration can be further improved.

(C) Amine Compound

An amine compound (hereinafter, sometimes simply referred to as component (C)) contained in the liquid composition of the present invention has a function of enhancing the molybdenum removal property. The amine compound is selected from the group consisting of amines and salts of amines and acids. Examples of such amine compounds include amine compounds such as 1-amino-2-propanol, 2-(methylamino)ethanol, 2-(ethylamino)ethanol, 2-(butylamino)ethanol, 2-(dimethylamino)ethanol, 2-(diethylamino)ethanol, 2-methoxyethylamine, 3-methoxypropylamine, 3-amino-1-propanol, 2-amino-2-methyl-1-propanol, 1-dimethylamino-2-propanol, 2-(2-aminoethoxyl)ethanol, morpholine, 4-(2-hydroxyethyl)morpholine, 2-(2-aminoethylamino)ethanol, 2,2'-iminodiethanol, di-2-propanolamine, 2,2'-(methylimino)diethanol and 1-piperazine ethanol. These amine compounds may be used alone or some of them may be used as a mixture.

Among these, 1-amino-2-propanol, 2-(methylamino)ethanol, 2-(ethylamino)ethanol, 2-(butylamino)ethanol, 2-(dimethylamino)ethanol, 2-(diethylamino)ethanol, 2-methoxyethylamine, 3-methoxypropylamine, 3-amino-1-propanol, 2-amino-2-methyl-1-propanol, 1-dimethylamino-2-propanol, 2-(2-aminoethoxyl)ethanol, morpholine and 4-(2-hydroxyethyl)morpholine are more preferable and 1-amino-2-propanol, 2-(methylamino)ethanol, 2-(dimethylamino)ethanol, 2-methoxyethylamine, 3-amino-1-propanol and morpholine are particularly preferable.

The amine compound (component (C)) is contained, per kilogram of the liquid composition, preferably in a range of 0.1-5 mol, more preferably in a range of 0.2-5 mol and particularly preferably in a range of 0.2-4 mol.

Moreover, the mix proportion of the amine compound (component (C)) to the copper ion source (component (B)) is preferably in a range of 1-40, more preferably in a range of 1-20 and particularly preferably in a range of 2-20 on molar basis. As long as the content of the amine compound (component (C)) in the liquid composition of the present invention is within the above-mentioned range, the etching rate and the wiring configuration can be further improved.

(D) Carboxylic Acid Ion Source

If necessary, the liquid composition according to the present invention may contain a carboxylic acid ion source (hereinafter, sometimes simply referred to as component (D)). The carboxylic acid ion source serves as a ligand to a copper ion, enhances stability of the liquid composition for etching a copper- and molybdenum-containing multilayer film, and has a function of stabilizing the etching rate. Moreover, it is also effective in preventing occurrence of residues precipitated upon diluting the liquid composition with water during the step of rinsing with water following etching.

The carboxylic acid ion source (component (D)) is not particularly limited as long as it is capable of supplying a carboxylic acid ion, preferable examples being monocarboxylic acids such as formic acid, acetic acid, propionic acid, butyric acid and isobutyric acid; dicarboxylic acids such as oxalic acid, malonic acid, succinic acid and maleic acid; aminocarboxylic acids such as glycine and alanine; hydroxycarboxylic acids such as glycolic acid, lactic acid, 2-hydroxyisobutyric acid, citric acid, tartaric acid and malic acid; and carboxylates thereof. These carboxylic acid ion sources may be used alone or some of them may be used as a mixture.

In addition, since carboxylic acid anhydrides such as acetic anhydride, propionic anhydride and maleic anhydride generate carboxylic acid through reaction with water, a carboxylic acid anhydride may also suitably be used as component (D).

Furthermore, since carboxylic esters such as ethyl acetate, propyl acetate, ethyl propionate, dimethyl malonate, diethyl malonate, dimethyl succinate and diethyl succinate generate carboxylic acid through hydrolysis reaction, a carboxylic ester may also suitably be used as component (D).

Among these, acetic acid, propionic acid, glycolic acid, malonic acid, succinic acid, lactic acid, citric acid, tartaric acid, malic acid; carboxylate thereof; and acetic anhydride are more preferable, and acetic acid, acetic anhydride, glycolic acid, malonic acid, succinic acid, lactic acid, and citric acid are particularly preferable in terms of availability and the like.

Moreover, copper salts of carboxylic acid such as copper acetate not only have a function as component (D) but also serve as the above-described copper ion source. For example, when a copper salt of carboxylic acid is contained in the liquid composition of the present invention, the content of component (D) is the total content of the copper salt of carboxylic acid and other carboxylic acid ion source.

Additionally, since a carboxylic acid anhydride such as acetic anhydride or propionic anhydride in which two carboxylic acid molecules are in a form of dehydration condensation generates two carboxylic acid molecules through reaction with water, when these carboxylic acid anhydrides are contained as component (D), the content of component (D) is defined to be twice as much as the content of the carboxylic acid anhydride.

The carboxylic acid ion source (component (D)) is contained, per kilogram of the liquid composition, preferably in a range of 0.05-5 mol, more preferably in a range of 0.1-5 mol and particularly preferably in a range of 0.1-4 mol.

Moreover, the mix proportion of the carboxylic acid ion source (component (D)) to the copper ion source (component (B)) is, on molar basic, preferably in a range of 0.05-20, more preferably in a range of 0.1-20 and particularly preferably in a range of 0.2-20. As long as the content of the carboxylic acid ion source (component (D)) in the liquid composition of the present invention is within the above-mentioned range, the etching rate and the wiring configuration will be good.

(E) Molybdic Acid Ion Source

If necessary, the liquid composition according to the present invention may contain a molybdic acid ion source (hereinafter, sometimes simply referred to as component (E)). The molybdic acid ion source has a function of adjusting the etching rate of the copper- and molybdenum-containing multilayer film and has a function of controlling etching and adjusting the cross-sectional configuration of the wiring. The concentration of the molybdic acid ion in the liquid composition used in the etching step will be increased due to dissolution of molybdenum. Accordingly, component (E) may be added to the liquid composition in advance so that the fluctuations in the etching properties (etching rate, etching configuration, stability of the liquid composition, etc.) upon an increase in the concentration of the molybdic acid ion can be minimized.

The molybdic acid ion source can be used without particular limitation as long as it is capable of supplying a molybdic acid ion. Such molybdic acid ions are not particularly limited as long as they are ion species soluble in the liquid composition. Besides an orthomolybdic acid ion containing one molybdenum atom in the ion, it may be an isopolymolybdic acid ion such as a paramolybdic acid ion containing seven molybdenum atoms in the ion, or a heteropolymolybdic acid ion containing a heteroelement in the ion.

Other than molybdenum, preferable examples of molybdic acid ion sources include molybdates such as ammonium molybdate, sodium molybdate and potassium molybdate; heteropolymolybdates such as phosphoammonium molybdate and silica ammonium molybdate; oxides and hydroxides such as molybdenum oxide and molybdenum blue; and molybdenum sulfide. These molybdic acid ion sources may be used alone or in combination.

Among these, molybdenum, ammonium molybdate, sodium molybdate, potassium molybdate and molybdenum oxide are more preferable and molybdenum, ammonium molybdate and molybdenum oxide are particularly preferable.

The content of the molybdic acid ion source (component (E)) in the liquid composition of the present invention is converted, upon calculation, into the content of the orthomolybdic acid ion containing one molybdenum atom in the ion. For example, if hexaammonium heptamolybdic acid containing seven molybdenum atoms in the ion or the like is used as the molybdic acid ion source (component (E)), the content of the molybdic acid ion source (component (E)) equals seven times the content of the hexaammonium heptamolybdic acid.

The molybdic acid ion source (component (E)) is contained, per kilogram of the liquid composition, preferably in a range of $1 \times 10^{-6}$ to $9 \times 10^{-2}$ mol, more preferably in a range of $1 \times 10^{-5}$ to $9 \times 10^{-2}$ mol and particularly preferably in a range of $2 \times 10^{-5}$ to $9 \times 10^{-2}$ mol in terms of an orthomolybdic acid ion. If the content of the molybdic acid ion source (component (E)) in the liquid composition of the present invention is within the above-mentioned range, the etching rate and the cross-sectional configuration of the wiring can further be improved.

Furthermore, by adding the molybdic acid ion source (component (E)) such that the mix proportion of the molybdic acid ion source (component (E)) to the copper ion source (component (B)) on molar basis is comparable to the molar ratio of the copper ion and the molybdic acid ion dissolved in the liquid composition during the etching step, fluctuation in the etching properties due to dissolution of copper and molybdenum can be minimized.

The pH of the above-described liquid composition of the present invention may lie in a range of 4-9. By making the pH of the liquid composition to lie within the above-mentioned range, the etching rate and the cross-sectional configuration of the wiring can further be improved. If the pH is less than 4, the removal property of the molybdenum tends to deteriorate, which is not favorable. On the other hand, if the pH exceeds 9, the etching rate tends to decrease, which unfavorably decreases the productivity. The preferable pH range of the liquid composition is pH 4-9.

(F) pH Adjuster

If necessary, the liquid composition according to the present invention may contain a pH adjuster (hereinafter, sometimes simply referred to as component (F)) in order to adjust the pH value. The pH adjuster (component F) is not particularly limited as long as it does not hinder the above-described effects of the liquid composition, preferable examples being ammonia; metal hydroxides such as sodium hydroxide and potassium hydroxide; amines such as isopropylamine and tertiary butylamine; hydroxylamines such as hydroxylamine; alkylammonium hydroxides such as tetramethylammonium hydroxide; inorganic acids such as hydrochloric acid, sulfuric acid, nitric acid, phosphoric acid and perchloric acid; and sulfonic acids such as methanesulfonic acid and trifluoromethanesulfonic acid. These pH adjusters may be used alone or some of them may be used as a mixture. Among these, ammonia, potassium hydroxide, isopropylamine, tertiary butylamine, tetramethylammonium hydroxide, nitric acid, sulfuric acid, phosphoric acid and perchloric acid are more preferable. However, since ammonia, sodium hydroxide and potassium hydroxide tend to decease the molybdenum removal property, they are preferably used in a small amount.

While an amine compound also serves as a pH adjuster in the liquid composition of the present invention, it is contained in component (C). In addition, while carboxylic acid also serves as a pH adjuster, it is contained in component (D).

The content of the pH adjuster contained in the liquid composition of the present invention can appropriately be determined according to the contents of other components such that the pH of the liquid composition has an intended value.

Other than the above-described components (A) to (C) and the optionally-added components (D) to (F), the liquid composition according to the present invention may contain water and other various additives generally used for a liquid etching composition within a range that does not hinder the above-described effects of the liquid composition. For example, water is preferably removed of metal ions, organic impurities, particles and the like by distillation, ion-exchange, filtering, adsorption treatment or the like, more preferably it is pure water and particularly preferably it is ultrapure water.

The liquid composition according to the present invention may contain an additive known as an adjuster for the copper etching rate. For example, it may contain, as an etching rate reducing inhibitor for copper, an azole compound such as benzotriazole, 5-amino-1H-tetrazole, imidazole or pyrazole, or phosphoric acid. Alternatively, as an etching rate elevating agent for copper, a halide ion such as a chloride ion or a bromide ion may be contained.

<Method for Etching Copper- and Molybdenum-Containing Multilayer Film>

An etching method according to the present invention is a method for etching a copper- and molybdenum-containing multilayer film, comprising the step of bringing the above-described liquid composition into contact with the above-described multilayer film. According to the present invention, a multilayer film containing copper and molybdenum can be etched together at a good etching rate. In addition, in a preferable embodiment of the present invention, multilayer-film wiring having a cross-sectional configuration with a taper angle of 15-75 degrees and a bottom CD loss of 0-2.5 µm can be obtained as described above.

The etching method of the present invention targets a copper- and molybdenum-containing multilayer film as the object to be etched. In a preferable embodiment of the present invention, a multilayer film as the object to be etched has a multilayer structure comprising a layer made of copper or a compound containing copper as a primary component and a layer made of molybdenum or a compound containing molybdenum as a primary component. Examples of the multilayer film include a two-layer film in which a layer made of copper or a compound containing copper as a primary component and a layer made of molybdenum or a compound containing molybdenum as a primary component are laminated, and a three-layer film in which a layer made of molybdenum or a compound containing molybdenum as a primary component, a layer made of copper or a compound containing copper as a primary component and a layer made of molybdenum or a compound containing molybdenum as a primary component are laminated. In particular, a three-layer film in which a layer made of molybdenum or a compound containing molybdenum as a primary component, a layer made of copper or a compound containing copper as a primary component and a layer made of molybdenum or a compound containing molybdenum as a primary component are laminated in this order is particularly preferable in terms of bringing out effective performance of the liquid composition of the present invention.

The etching method of the present invention further targets, as the object to be etched, a multilayer-film wiring substrate which has an oxide layer (IGZO) including indium, gallium and zinc laminated on the substrate, and further a multilayer film including at least a layer containing molybdenum and a layer containing copper provided thereon. In particular, a film structure in which an oxide layer (IGZO) including indium, gallium and zinc is laminated on the substrate, and further a layer made of molybdenum or a compound containing molybdenum as a primary component, a layer made of copper or a compound containing copper as a primary component and a layer made of molybdenum or a compound containing molybdenum as a primary component are laminated in this order is particularly preferable in terms of bringing out effective performance of the liquid composition of the present invention.

Examples of copper or the compound made of copper as a primary component include copper (metal), copper alloys, copper oxide and copper nitride. Examples of molybdenum or the compound made of molybdenum as a primary component include molybdenum (metal), molybdenum alloys, and oxides or nitrides thereof.

The object to be etched may be obtained, for example, by: sequentially laminating a layer made of molybdenum, a layer made of copper and a layer made of molybdenum on a substrate (for example, a glass substrate) to form a multilayer film, i.e., a three-layer film; applying a resist thereon; and exposing and transferring a desired pattern mask for development to form a desired resist pattern.

Other than the above-mentioned glass substrate, the substrate on which a multilayer film is formed may be, for example, a substrate having a layer structure in which gate wiring is formed on a glass plate, and an insulating film made of silicon nitride or the like is provided on the gate wiring.

According to the present invention, the above-described liquid composition is brought into contact with the object to be etched so as to etch the multilayer film to form desired multilayer-film wiring, thereby obtaining multilayer-film wiring provided with a multilayer film comprising a layer containing molybdenum and a layer containing copper. Such copper- and molybdenum-containing multilayer-film wiring may preferably be used as wiring or the like for a display device such as a flat panel display.

The process of bringing the liquid composition into contact with an object to be etched is not particularly limited. For example, a wet etching process such as a process in which the liquid composition is brought into contact with the object through dropping (sheet-fed spin processing) or spraying, or a process in which the object to be etched is immersed in the liquid composition can be employed. According to the present invention, any process can be used for etching. Especially, the process in which the liquid composition is brought into contact with the object to be etched through spraying is preferably employed.

The process in which the liquid composition is brought into contact with the object through spraying may be a process in which the liquid composition is downwardly sprayed from above the object to be etched, or a process in which the liquid composition is upwardly sprayed from underneath the object to be etched. In doing so, the spray nozzle may be secured or made to perform swinging or sliding movement. Alternatively, the spray nozzle may be disposed vertically downward or tilted. The object to be etched may be secured or made to perform an oscillating or rotating movement, and may be disposed horizontally or tilted.

The temperature of the liquid composition upon use thereof is preferably 10-70° C. and particularly preferably 20-50° C. Since a good etching rate can be obtained if the temperature of the liquid composition is 10° C. or higher, high production efficiency can be achieved. Meanwhile, at 70° C. or lower, change in the composition of the liquid can be suppressed, thereby maintaining the etching conditions constant. While the etching rate can be increased by increasing the temperature of the liquid composition, an optimal treatment temperature can appropriately be determined considering minimum change in the composition of the liquid composition, and else.

EXAMPLES

Hereinafter, the present invention will be described in more detail by way of examples. The scope of the present invention, however, should not be limited in any way to these examples.

<Evaluation of Cross-Sectional Configuration of Multilayer Wiring after Etching>

The cross-sections of the wiring of the etched multilayer thin film samples containing copper layers and molybdenum layers obtained in Examples and Comparative Examples were observed using a scanning electron microscope ("Type S5000H (model number)"; from Hitachi) with magnification of ×30,000 (accelerating voltage: 2 kV, emission current: 10 µA). Based on the obtained SEM images, those having a wiring cross-section with a forward tapered shape with a taper angle of 15-75 degrees, and having bottom CD loss of 2.5 µm or less passed as acceptable products.

<Evaluation of Surface Profile of Multilayer Wiring after Etching>

The surfaces of the wiring of the etched multilayer thin film samples containing copper layers and molybdenum layers obtained in Examples and Comparative Examples after peeling off the resists by immersing them in acetone at 25° C. for 300 seconds were observed using a scanning electron microscope ("Type S5000H (model number)"; from Hitachi) with magnification of ×20,000 (accelerating voltage: 2 kV, emission current: 10 µA). Based on the obtained SEM images, those with no residue of copper or molybdenum on the surfaces passed as acceptable products.

<Evaluation of IGZO Etching Rate (E.R)>

The film thicknesses of IGZO of the processed IGZO/glass substrates obtained in Examples and Comparative Examples were measured before and after the process with an optical thin-film property measurement device, n&k Analyzer 1280, from n&k Technology, Inc. Then, the difference in the film thicknesses before and after the process was divided by the etch time, thereby calculating E.R. Those having an IGZO E.R of less than 10 Å/min (1 nm/min) passed as acceptable products.

Reference Example 1

Preparation of
Molybdenum/Copper/Molybdenum/Glass Substrate

Molybdenum was sputtered onto a glass substrate (dimensions: 150 mm×150 mm) to form a film of a layer made of molybdenum (metal) (molybdenum film thickness: 200 Å (20 nm)). Next, copper was sputtered to form a film of a layer made of copper (metal) (thickness of copper film: 5000 Å (500 nm)). Then, molybdenum was again sputtered to form a film of a layer made of molybdenum (metal) (molybdenum film thickness: 200 Å (20 nm)), thereby obtaining a three-layer film structure of molybdenum/copper/molybdenum. A resist was further applied and a linear pattern mask (line width: 20 µm) was exposed and transferred for subsequent development, thereby preparing a molybdenum/copper/molybdenum/glass substrate formed with a resist pattern. The film thickness ratio of the copper layer and the molybdenum layer in the copper- and molybdenum-containing multilayer film shown in Reference Example 1 is (thickness of molybdenum film/thickness of copper film)=(200+200)/5000=0.08.

Reference Example 2

Preparation of IGZO/Glass Substrate

IGZO having indium, gallium, zinc and oxygen at an element ratio of 1:1:1:4 was sputtered onto a glass substrate (dimensions: 150 mm×150 mm) to form a film of a layer made of IGZO (IGZO film thickness: 500 Å (50 nm)), thereby preparing an IGZO/glass substrate.

Reference Example 3

Preparation of Molybdenum/Copper/Molybdenum/IGZO/Glass Substrate

An IGZO film having indium, gallium, zinc and oxygen at an element ratio of 1:1:1:4 was sputtered onto a glass substrate (dimensions: 150 mm×150 mm) to a film thickness of 500 Å (50 nm)). Next, molybdenum was sputtered to form a film of a layer made of molybdenum (metal) (molybdenum film thickness: 300 Å (30 nm)), then copper was sputtered to form a film of a layer made of copper (metal) (thickness of copper film: 3000 Å (300 nm)), and molybdenum was again sputtered to form a film of a layer made of molybdenum (metal) (molybdenum film thickness: 300 Å (30 nm)), thereby obtaining a molybdenum/copper/molybdenum/IGZO structure. A resist was further applied and a linear pattern mask (line width: 20 μm) was exposed and transferred for subsequent development, thereby preparing a molybdenum/copper/molybdenum/IGZO/glass substrate formed with a resist pattern. The film thickness ratio of the copper layer and the molybdenum layer in the copper- and molybdenum-containing multilayer film shown in Reference Example 3 is (thickness of molybdenum film/thickness of copper film)=(300+300)/3000=0.2.

Example 1

To a polypropylene container with a volume of 10 L, 6.96 kg of pure water, 0.64 kg of maleic anhydride (Wako Pure Chemical Industries, special grade, molecular weight 98.06) as the maleic acid ion source (A), 0.15 kg of copper hydroxide (Wako Pure Chemical Industries, special grade, molecular weight 97.56) as the copper ion source (B), 0.70 kg of acetic acid (Wako Pure Chemical Industries, special grade, molecular weight 60.05) as component (D), and 0.008 kg of ammonium molybdate as component (E) were added. As an amine compound (C) that also serves as pH adjuster (F), 1.54 kg of 1-amino-2-propanol (Wako Pure Chemical Industries, special grade, molecular weight 75.11) was added and then agitated. After confirming the dissolution of the respective components, they were again agitated, thereby preparing a liquid composition. The pH of the resulting liquid composition was 6.0.

The contents of the respective components in the liquid composition obtained as described above were as follows: component (A) was 0.65 mol and component (B) was 0.16 mol, per kilogram of the liquid composition, where the mix proportion (molar ratio) of component (A) to component (B) was 4.1. The content of component (C) per kilogram of the liquid composition was 2.04 mol. The mix proportion (molar ratio) of component (C) to component (B) was 13.0. The content of component (D) per kilogram of the liquid composition was 1.17 mol. The mix proportion (molar ratio) of component (D) to component (B) was 7.4. The content of component (E) per kilogram of the liquid composition was 0.0044 mol.

This liquid composition was used to perform spray treatment at 35° C. on the molybdenum/copper/molybdenum/glass substrate having the resist pattern obtained in Reference Example 1 formed thereon, using a small-sized etching equipment (from Kanto Kikai Kogyo). The molybdenum/copper/molybdenum/glass substrate was disposed horizontally such that the film-formed plane faces up while the spray nozzle was secured to point vertically downwards.

The time that took until the part of the molybdenum/copper/molybdenum multilayer film that was not covered with the resist disappeared to expose the transparent glass substrate (just-etch time) was visually confirmed to be 148 seconds. The molybdenum/copper/molybdenum/glass substrate etched for 222 seconds (50% overetching condition) was rinsed with pure water, dried with a blower, and observed using an optical microscopic. As a result, the exposed part of the molybdenum/copper/molybdenum multilayer film other than the part covered with the patterned resist was confirmed to have completely disappeared.

When the etched molybdenum/copper/molybdenum/glass substrate was ruptured to observe the cross-section of the substrate with a scanning secondary electron microscope, the angle (taper angle) between the etched plane at the edge of the wiring and the underlying substrate was 65 degrees with a forward tapered shape while the horizontal distance (bottom CD loss) from the edge of the lower layer (bottom) of the wiring to the edge of the resist was 1.7 μm. The resulting evaluation results are shown in Table 1 below. The contents of the respective components indicated in Table 1 are expressed in the molar numbers of the respective components contained per kilogram of the liquid composition. In addition, the bottom CD loss values were determined under 50% overetching conditions.

Examples 2-6

In Examples 2-6, etchants were prepared in the same manner as Example 1 except that a mix amount of 1.48 kg of 2-(methylamino)ethanol (Example 2), a mix amount of 1.67 kg of 2-(dimethylamino)ethanol (Example 3), a mix amount of 1.49 kg of 2-methoxyethylamine (Example 4), a mix amount of 1.48 kg of 3-amino-1-propanol (Example 5), and a mix amount of 1.70 kg of morpholine (Example 6) were used as component (C) (the amount of pure water was adjusted such that the total weight of the liquid composition was 10 kg, which also applies to preparation of the following liquid compositions). The etchants were used to perform spray treatment (50% overetching condition). The evaluation results are shown in Table 1.

Figure 2:
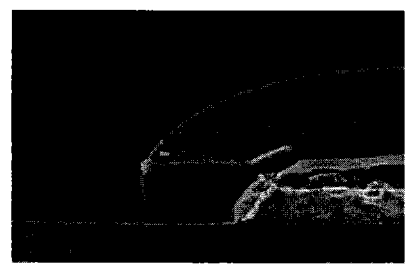
FIG. 2 An SEM image of the cross-section of wiring having a multilayer-film structure comprising copper and molybdenum, which had been etched according to Example 3.
Figure 3:
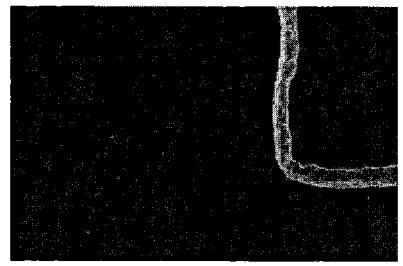
FIG. 3 An SEM image of the surface of wiring having a multilayer-film structure comprising copper and molybdenum, which had been etched according to Example 3.

The cross-sections and the surfaces of the substrates were observed with a scanning secondary electron microscope. As a result, all of the substrates subjected to the spray treatment with any of the liquid compositions had good taper angle and bottom CD loss, and no molybdenum residue was observed. A secondary electron microscope image of the cross-section of the wiring of the substrate obtained in Example 3 is shown in FIG. 2 while the secondary electron microscope image of the surface of the substrate is shown in FIG. 3.

Comparative Example 1

An etchant was prepared in the same manner as Example 1 except that a mix amount of 1.26 kg of 2-aminoethanol was used instead of 1-amino-2-propanol, i.e., component (C) in Example 1. The etchant was used to perform spray treatment (50% overetching condition). The evaluation results are shown in Table 1. The cross-section and the surface of the substrate were observed with a scanning secondary electron microscope. As a result, molybdenum was observed to have remained.

Comparative Example 2

Etchants were prepared in the same manner as Example 1 except that a mix amount of 0.42 kg of maleic anhydride as component (A), a mix amount of 0.46 kg of acetic acid as component (D), and a mix amount of 0.22 kg of ammonia, instead of 1-amino-2-propanol i.e., component (C) in Example 1 were used. The etchants were used to perform spray treatment (50% overetching condition). The evaluation results are shown in Table 1.

Figure 4:
FIG. 4 An SEM image of the cross-section of wiring having a multilayer-film structure comprising copper and molybdenum, which had been etched according to Comparative Example 2.
Figure 5:
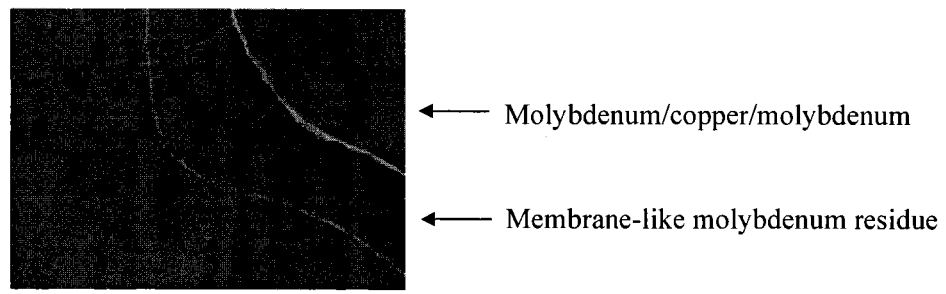
FIG. 5 An SEM image of the surface of wiring having a multilayer-film structure comprising copper and molybdenum, which had been etched according to Comparative Example 2.

The cross-sections and the surfaces of the substrates were observed with a scanning secondary electron microscope. As a result, molybdenum was observed to have remained. A secondary electron microscope image of the cross-section of the wiring of the substrate obtained in Comparative Example 2 is shown in FIG. 4 while a secondary electron microscope image of the surface of the substrate is shown in FIG. 5. Membrane-like molybdenum residue was observed to have remained adjacent to the wiring. The part adjacent to the wiring is right underneath the part covered with the resist where it has poor liquid displacement and thus molybdenum tends to remain. Hence, referring to Comparative Examples 1 and 2, chemical compositions that do not contain amine compound (C) are found to have insufficient molybdenum removal property.

Comparative Example 3

Figure 6:
FIG. 6 An SEM image of the cross-section of wiring having a multilayer-film structure comprising copper and molybdenum, which had been etched according to Comparative Example 3.

To a polypropylene container with a volume of 10 L, 7.7 kg of pure water, 0.5 kg of malic acid, 0.3 kg of copper acetate (II) monohydrate, 0.5 kg of imidazole and 1.0 kg of triethanolamine were added and then agitated. After confirming the dissolution of the respective components, they were again agitated, thereby preparing a liquid composition. The pH of the resulting liquid composition was 6.8. This liquid composition was used to perform spray treatment (50% overetching condition). The just-etch time was 242 seconds, the taper angle was 80 degrees and the bottom CD loss was 4.4 μm. A secondary electron microscope image of the cross-section of the wiring of the substrate obtained in Comparative Example 3 is shown in FIG. 6. The bottom CD loss was great and good wiring configuration was not achieved. In addition, molybdenum residue was observed to have remained adjacent to the wiring. Accordingly, referring to Comparative Example 3, the chemical composition that does not contain maleic anhydride ion source (A) and amine compound (C) is found to fail in giving good wiring configuration and have insufficient molybdenum removal property.

TABLE 1

| Composition of liquid composition (mol/Kg) | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Component A: Maleic anhydride | 0.65 | 0.65 | 0.65 | 0.65 | 0.65 | 0.65 | 0.65 | 0.09 | — |
| Component B | Copper hydroxide: 0.16 | Copper hydroxide: 0.16 | Copper hydroxide: 0.16 | Copper hydroxide: 0.16 | Copper hydroxide: 0.16 | Copper hydroxide: 0.16 | Copper hydroxide: 0.16 | Copper hydroxide: 0.13 | Copper acetate: 0.17 |
| Component C | 1-Amino-2-propanol: 2.04 | 2-(Methylamino)ethanol: 1.97 | 2-(Dimethylamino)ethanol: 1.97 | 2-Methoxyethylamine: 1.98 | 3-Amino-1-propanol: 1.97 | Morpholine: 1.95 | — | — | — |
|  | — | — | — | — | — | — | 2-Aminoethanol: 2.05 | Ammonia: 2.24 | Triethanolamine: 0.67 Imidazole: 0.73 |
| Component D | Acetic acid: 1.17 | Acetic acid: 1.17 | Acetic acid: 1.17 | Acetic acid: 1.17 | Acetic acid: 1.17 | Acetic acid: 1.17 | Acetic acid: 1.17 | Acetic acid: 0.77 | Malic acid: 0.37 |
| Component E: Hexaammonium heptamolybdic acid (x7) | 0.0044 | 0.0044 | 0.0044 | 0.0044 | 0.0044 | 0.0044 | 0.0044 | — | — |
| Molar ratio of Component A/Component B | 4.1 | 4.1 | 4.1 | 4.1 | 4.1 | 4.1 | 4.1 | 2.8 | — |
| Molar ratio of Component C/Component B | 13.0 | 12.6 | 12.0 | 12.7 | 12.6 | 12.4 | — | — | — |
| Molar ratio of Component D/Component B | 7.4 | 7.4 | 7.4 | 7.4 | 7.4 | 7.4 | 7.4 | 6.4 | 2.2 |
| pH of liquid composition | 6.0 | 6.0 | 6.0 | 6.0 | 6.0 | 6.0 | 6.0 | 6.0 | 6.8 |
| Just-etch time (sec) | 148 | 131 | 118 | 98 | 128 | 125 | 109 | 74 | 242 |
| Taper angle (deg) | 65 | 60 | 65 | 65 | 65 | 65 | 60 | 65 | 80 |
| Bottom CD loss (μm) | 1.7 | 1.5 | 1.9 | 1.6 | 1.6 | 1.6 | 1.7 | 2.2 | 4.4 |

TABLE 1-continued

| Composition of liquid composition (mol/Kg) | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Molybdenum residue | Absent | Absent | Absent | Absent | Absent | Absent | Present | Present | Present |
| Etching rate (μm/min) | 0.219 | 0.247 | 0.275 | 0.331 | 0.253 | 0.259 | 0.297 | 0.438 | 0.134 |

Examples 7-12

Figure 7:
FIG. 7 An SEM image of the cross-section of wiring having a multilayer-film structure comprising copper and molybdenum, which had been etched according to Example 9.
Figure 8:
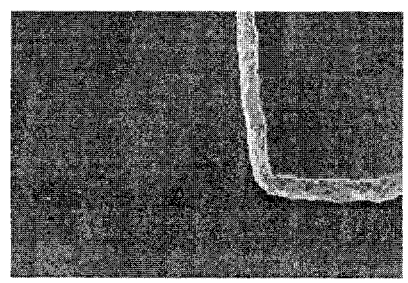
FIG. 8 An SEM image of the surface of wiring having a multilayer-film structure comprising copper and molybdenum, which had been etched according to Example 9.

The liquid compositions having the compositions indicated in Table 2 were used to perform spray treatment on the molybdenum/copper/molybdenum/glass substrates (50% overetching condition) in the same manner as Example 1. The evaluation results are shown in Table 2. A scanning secondary electron microscope was used to observe the cross-sections and the surfaces of the substrates. As a result, all of the substrates subjected to the treatment with any of the liquid compositions had good taper angle and bottom CD loss, and no molybdenum residue was observed. A secondary electron microscope image of the cross-section of the wiring of the substrate obtained in Example 9 is shown in FIG. 7 while a secondary electron microscope image of the surface of the substrate is shown in FIG. 8.

Comparative Example 4

An etchant was prepared in the same manner as Example 12 except that maleic anhydride as component (A) in Example 12 was excluded and that the mix amount of sulfuric acid as component (F) was 0.33 kg. The etchant was used to perform spray treatment (50% overetching condition). Even after 400 seconds of treatment, the molybdenum/copper/molybdenum substrate did not become transparent and etching was incomplete. Hence, a liquid composition that does not contain component (A) is found to be incapable of etching a multilayer film containing copper and molybdenum.

Comparative Example 5

An etchant was prepared in the same manner as Example 12 except that copper hydroxide as component (B) and ammonium molybdate as component (E) in Example 12 were excluded and that the mix amount of 1-amino-2-propanol as component (C) was 0.99 kg. The etchant was used to perform spray treatment (50% overetching condition). Even after 400 seconds of treatment, the molybdenum/copper/molybdenum substrate did not become transparent and etching was incomplete. Hence, a liquid composition that does not contain component (B) is found to be incapable of etching a multilayer film containing copper and molybdenum.

TABLE 2

| Composition of liquid composition (mol/Kg) | Example 7 | Example 8 | Example 9 | Example 10 | Example 11 | Example 12 | Comparative Example 4 | Comparative Example 5 |
|---|---|---|---|---|---|---|---|---|
| Component A: Maleic anhydride | 0.65 | 0.65 | 0.97 | 0.97 | 0.97 | 0.43 | — | 0.43 |
| Component B: Copper hydroxide | 0.24 | 0.31 | 0.24 | 0.24 | 0.24 | 0.16 | 0.16 | — |
| Component C | 2-(Dimethylamino)ethanol: 1.80 | 2-(Dimethylamino)ethanol: 1.68 | 2-(Dimethylamino)ethanol: 2.18 | 2-(Dimethylamino)ethanol: 1.94 | 2-(Dimethylamino)ethanol: 1.62 | 1-Amino-2-propanol: 1.15 | 1-Amino-2-propanol: 1.15 | 1-Amino-2-propanol: 1.31 |
| Component D: Acetic acid | 1.17 | 1.17 | 1.17 | 0.78 | 0.39 | 0.78 | 0.78 | 0.78 |
| Component E: Hexaammonium heptamolybdic acid (x7) | 0.0044 | 0.0044 | 0.0044 | 0.0044 | 0.0044 | 0.0044 | 0.0044 | — |
| Component F | — | — | — | — | — | — | Sulfuric acid: 0.34 | — |
| Molar ratio of Component A/Component B | 2.8 | 2.1 | 4.1 | 4.1 | 4.1 | 2.8 | — | — |
| Molar ratio of Component C/Component B | 7.6 | 5.4 | 9.3 | 8.2 | 6.9 | 7.3 | 7.3 | — |
| Molar ratio of Component D/Component B | 5.0 | 3.7 | 5.0 | 3.3 | 1.7 | 5.0 | 5.0 | — |
| pH of liquid composition | 6.0 | 6.0 | 6.0 | 6.0 | 6.0 | 5.5 | 5.5 | 5.5 |
| Just-etch time (sec) | 147 | 165 | 127 | 137 | 139 | 139 | >400 | >400 |
| Taper angle (deg) | 65 | 60 | 65 | 65 | 65 | 65 | — | — |
| Bottom CD loss (μm) | 1.7 | 1.5 | 1.9 | 1.6 | 1.6 | 1.6 | — | — |

TABLE 2-continued

| Composition of liquid composition (mol/Kg) | Example 7 | Example 8 | Example 9 | Example 10 | Example 11 | Example 12 | Comparative Example 4 | Comparative Example 5 |
|---|---|---|---|---|---|---|---|---|
| Molybdenum residue | Absent | Absent | Absent | Absent | Absent | Absent | — | — |
| Etching rate (μm/min) | 0.220 | 0.196 | 0.255 | 0.236 | 0.233 | 0.233 | <0.081 | <0.081 |

Examples 13-14

The liquid compositions having the compositions indicated in Table 3 were used to perform spray treatment on the molybdenum/copper/molybdenum/glass substrates (50% overetching condition) in the same manner as Example 1. The evaluation results are shown in Table 3. All of the substrates subjected to the treatment with any of the liquid compositions had good taper angle and bottom CD loss, and no molybdenum residue was observed.

TABLE 3

| Composition of liquid composition (mol/Kg) | Example 13 | Example 14 |
|---|---|---|
| Component A: Maleic anhydride | 0.65 | 0.65 |
| Component B: Copper hydroxide | 0.24 | 0.24 |
| Component C | 1-Amino-2-propanol: 1.70 | 1-Amino-2-propanol: 1.97 |
| Component D: | Acetic acid: 1.17 | Acetic acid: 1.17
Lactic acid: 0.06 |
| Component E: Hexaammonium heptamolybdic acid (×7) | — | 0.0044 |
| Component F | — | — |
| Molar ratio of Component A/Component B | 2.8 | 2.8 |
| Molar ratio of Component C/Component B | 7.2 | 8.3 |
| Molar ratio of Component D/Component B | 5.0 | 5.2 |
| pH of liquid composition | 5.5 | 6.5 |
| Just-etch time (sec) | 194 | 322 |
| Taper angle (deg) | 60 | 45 |
| Bottom CD loss (μm) | 1.6 | 1.6 |

TABLE 3-continued

| Composition of liquid composition (mol/Kg) | Example 13 | Example 14 |
|---|---|---|
| Molybdenum residue | Absent | Absent |
| Etching rate (μm/min) | 0.167 | 0.101 |

Examples 15-17

Figure 9:
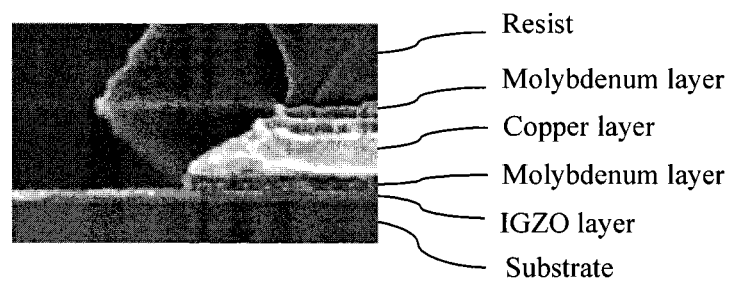
FIG. 9 An SEM image of the cross-section of wiring having a multilayer-film structure comprising copper and molybdenum, which had been etched according to Example 16.
Figure 10:
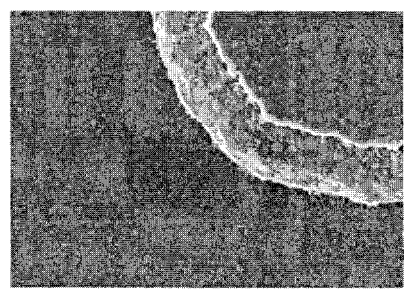
FIG. 10 An SEM image of the surface of wiring having a multilayer-film structure comprising copper and molybdenum, which had been etched according to Example 16.

The liquid compositions, i.e., etchants, having the compositions indicated in Table 4 were used to perform spray treatment on the molybdenum/copper/molybdenum/IGZO/glass substrates obtained in Reference Example 3 having the resist pattern formed thereon (50% overetching condition). The evaluation results are shown in Table 4. All of the substrates subjected to the treatment with any of the liquid compositions had good taper angle and bottom CD loss, and no molybdenum residue was observed. Moreover, no damage on the IGZO layer was observed. A secondary electron microscope image of the cross-section of the wiring of the substrate obtained in Example 16 is shown in FIG. 9 while a secondary electron microscope image of the surface of the substrate is shown in FIG. 10.

Furthermore, the liquid compositions having the compositions indicated in Table 4 were used to perform spray treatment at 35° C. for 300 seconds on the IGZO/glass substrates obtained in Reference Example 2, using a small-sized etching equipment (from Kanto Kikai Kogyo). The film thicknesses of IGZO before and after the process were measured with an optical thin-film property measurement device, n&k Analyzer 1280, from n&k Technology Inc. Then, the difference in the film thicknesses before and after the process was divided by the etch time, thereby calculating the etching rate. The resulting evaluation results are shown in Table 4, where the E.R of IGZO was less than 10 Å/min (1 nm/min).

TABLE 4

| Composition of liquid composition (mol/Kg) | Example 15 | Example 16 | Example 17 |
|---|---|---|---|
| Component A: Maleic anhydride | 0.65 | 0.65 | 0.65 |
| Component B: Copper hydroxide | 0.16 | 0.24 | 0.24 |
| Component C | 2-Methoxyethylamine: 2.00 | 2-(Dimethylamino)ethanol: 2.55 | 2-(Dimethylamino)ethanol: 1.97 |
| Component D: | Acetic acid: 1.17 | Acetic acid: 1.17 | Acetic acid: 1.17
Lactic acid: 0.06 |
| Component E: Hexaammonium heptamolybdic acid (×7) | 0.0044 | 0.0044 | 0.0044 |

TABLE 4-continued

| Composition of liquid composition (mol/Kg) | Example 15 | Example 16 | Example 17 |
|---|---|---|---|
| Component F | Phosphoric acid: 0.01 | Perchloric acid: 0.50 | — |
| Molar ratio of Component A/Component B | 4.1 | 2.8 | 2.8 |
| Molar ratio of Component C/Component B | 12.7 | 10.8 | 83 |
| Molar ratio of Component D/Component B | 7.4 | 5.0 | 5.2 |
| pH of liquid composition | 6.0 | 6.0 | 6.5 |
| Just-etch time (sec) | 154 | 235 | 197 |
| Taper angle (deg) | 40 | 40 | 40 |
| Bottom CD loss (μm) | 1.1 | 1.1 | 0.8 |
| IGZO E.R. (Å/min) | <10 | <10 | <10 |
| Etching rate (μm/min) | 0.140 | 0.092 | 0.110 |

As can be seen from the evaluation results shown above, all of the liquid compositions of Examples were capable of etching a multilayer film containing copper and molybdenum at a good etching rate giving good wiring configuration after etching. Moreover, when a molybdenum/copper/molybdenum/IGZO/glass substrate using IGZO as a semiconductor layer was etched, the copper- and molybdenum-containing multilayer film was selectively etched at a good etching rate giving good wiring configuration after the etching and no damage on IGZO was observed.

INDUSTRIAL APPLICABILITY

A liquid composition according to the present invention can suitably be used for etching a multilayer film containing copper and molybdenum such that wiring having a copper- and molybdenum-containing multilayer structure can be etched together at a good etching rate, thereby achieving high productivity.

The invention claimed is:
1. A liquid composition, comprising:
(A) a maleic acid ion source;
(B) a copper ion source; and
(C) an amine compound of at least one type selected from the group consisting of 1-amino-2-propanol, 2-(methylamino)ethanol, 2-(ethylamino)ethanol, 2-(butylamino)ethanol, 2-(dimethylamino)ethanol, 2-(diethylamino)ethanol, 2-methoxyethylamine, 3-methoxypropylamine, 3-amino-1-propanol, 2-amino-2-methyl-1-propanol, 1-dimethylamino-2-propanol, 2-(2-aminoethoxy)ethanol, morpholine and 4-(2-hydroxyethyl)morpholine,
wherein a pH value of the liquid composition is from 4-9.
2. The liquid composition according to claim 1, wherein the maleic acid ion source (A) is at least one type selected from the group consisting of maleic acid and maleic anhydride.
3. The liquid composition according to claim 1, wherein the copper ion source (B) is at least one type selected from the group consisting of copper, copper sulfate, copper nitrate, copper acetate and copper hydroxide.
4. The liquid composition according to claim 1, wherein a mix proportion of the maleic acid ion source (A) to the copper ion source (B) is from 0.1-10 on molar basis.
5. The liquid composition according to claim 1, wherein a mix proportion of the amine compound (C) to the copper ion source (B) is from 2-20 on molar basis.
6. The liquid composition according to claim 1, further comprising (D) a carboxylic acid ion source.
7. The liquid composition according to claim 6, wherein the carboxylic acid ion source (D) is at least one type selected from the group consisting of acetic acid, glycolic acid, malonic acid, succinic acid, lactic acid, citric acid, carboxylates thereof and acetic anhydride.
8. The liquid composition according to claim 6, wherein a mix proportion of the carboxylic acid ion source (D) to the copper ion source (B) is from 0.1-10 on molar basis.
9. The liquid composition according to claim 1, further comprising (E) a molybdic acid ion source.
10. The liquid composition according to claim 1, which is suitable for selectively etching a layer made of copper or a compound containing copper as a primary component and a layer made of molybdenum or a compound containing molybdenum as a primary component from a substrate having an oxide layer made of indium, gallium and zinc (IGZO) laminated thereon and further having a multilayer film comprising the layer made of copper or a compound containing copper as a primary component and the layer made of molybdenum or a compound containing molybdenum as a primary component laminated thereon.
11. A method for selectively etching a layer made of copper or a compound comprising copper as a primary component and a layer made of molybdenum or a compound comprising molybdenum as a primary component from a substrate having a multilayer film comprising the layer made of copper or a compound comprising copper as a primary component and the layer made of molybdenum or a compound comprising molybdenum as a primary component laminated thereon, the method comprising contacting the liquid composition according to claim 1 with the multilayer film.
12. The etching method according to claim 11, wherein the multilayer film is a two-layer film in which a layer made of molybdenum or a compound comprising molybdenum as a primary component is laminated with a layer made of copper or a compound comprising copper as a primary component.

13. The etching method according to claim 11, wherein the multilayer film is a three-layer film in which a layer made of molybdenum or a compound comprising molybdenum as a primary component, a layer made of copper or a compound comprising copper as a primary component and a layer made of molybdenum or a compound comprising molybdenum as a primary component are laminated in this order.

14. A method for manufacturing a multilayer-film wiring substrate in which a multilayer film comprising at least a layer made of copper or a compound comprising copper as a primary component and a layer made of molybdenum or a compound comprising molybdenum as a primary component is applied on a substrate, the method comprising:

sequentially applying a layer made of molybdenum or a compound comprising molybdenum as a primary component and a layer made of copper or a compound comprising copper as a primary component on the substrate to form a multilayer film;

covering the multilayer film with a resist to form a resist film;

exposing and developing the resist film to form a predetermined resist pattern, thereby forming an object to be etched; and contacting the object to be etched with the liquid composition according to claim 1 to etch the multilayer film, thereby forming multilayer-film wiring.

15. A multilayer-film wiring substrate manufactured by the manufacturing method according to claim 14.

16. The method according to claim 11, wherein a ratio of a film thickness of the layer made of molybdenum or a compound comprising molybdenum as a primary component (thickness of molybdenum film) to a film thickness of the layer made of copper or a compound comprising copper as a primary component (thickness of copper film) is from 0.05-1.

* * * * *